United States Patent
Kolar

(10) Patent No.: US 11,984,897 B2
(45) Date of Patent: May 14, 2024

(54) PEAK-DETECTOR CIRCUIT AND METHOD FOR EVALUATING A PEAK OF A FIRST INPUT VOLTAGE

(71) Applicant: ams AG, Premstaetten (AT)

(72) Inventor: Dalibor Kolar, Graz (AT)

(73) Assignee: AMS AG, Premstaetten (AT)

( * ) Notice: Subject to any disclaimer, the term of this patent is extended or adjusted under 35 U.S.C. 154(b) by 84 days.

(21) Appl. No.: 17/780,567

(22) PCT Filed: Nov. 11, 2020

(86) PCT No.: PCT/EP2020/081791
§ 371 (c)(1),
(2) Date: May 27, 2022

(87) PCT Pub. No.: WO2021/104879
PCT Pub. Date: Jun. 3, 2021

(65) Prior Publication Data
US 2023/0353133 A1 Nov. 2, 2023

(30) Foreign Application Priority Data
Nov. 28, 2019 (EP) .................... 19212174

(51) Int. Cl.
*H03K 5/1532* (2006.01)
*G01R 19/04* (2006.01)
*H03K 5/08* (2006.01)

(52) U.S. Cl.
CPC .......... *H03K 5/1532* (2013.01); *G01R 19/04* (2013.01); *H03K 5/08* (2013.01)

(58) Field of Classification Search
CPC ..................................... G01R 19/04

USPC ........................................... 327/58
See application file for complete search history.

(56) References Cited

U.S. PATENT DOCUMENTS

2010/0008007 A1    1/2010   Barsky

FOREIGN PATENT DOCUMENTS

| CN | 107968654 A | 4/2018 | |
| WO | 9800918 A1 | 1/1998 | |
| WO | WO-9800918 A1 * | 1/1998 | ............. G01R 19/04 |

OTHER PUBLICATIONS

International Search Report issued for the corresponding international patent application No. PCT/EP2020/081791, dated Jan. 28, 2021, 2 pages (for informational purposes only).
Texas Instruments, "Wide-Bandwidth, DC Restoration Circuit", SBOS299E, Feb. 2004, 34 pages, OPA615, Texas Instruments Incorporated.

(Continued)

Primary Examiner — Tomi Skibinski
(74) Attorney, Agent, or Firm — Viering, Jentschura & Partner mbB

(57) ABSTRACT

A peak-detector circuit may include a first input terminal for providing a first input voltage, a first rectifying element with an anode connected to the first input terminal, a first capacitor with a first electrode connected to a cathode of the first rectifying element, a first terminal coupled to the first electrode of the first capacitor, a second rectifying element with a cathode connected to the first input terminal, a second capacitor, a first switch coupling an anode of the second rectifying element to a first electrode of the second capacitor, and a second terminal coupled to the first electrode of the second capacitor.

14 Claims, 7 Drawing Sheets

(56) References Cited

OTHER PUBLICATIONS

Alonso, G. et al., "LTC6244 High Speed Peak Detector", https://www.analog.com/en/technical-articles/ltc6244-high-speed-peak-detector.html#, retrieved on May 15, 2019, 7 pages, Analog Devices.

Horowitz, P. et al., "Electronic Devices and Circuit Theory", Art of Electronics, 2015, pp. 254-255, Third Edition, Cambridge University Press.

Osipov, D. et al., "A Novel HV-Switch Scheme with Gate-Source Overvoltage Protection for Bidirectional Neural Interfaces", 2015 IEEE International Conference on Electronics, Circuits, and Systems (ICECS), Dec. 6-9, 2015, pp. 25-28, IEEE.

Pérez, J. et al., "Automatic Gain Control", Analog Circuits and Signal Processing, 2011, pp. 13-14, Springer Science+Business Media.

Presti, C. D. et al., "Fast Peak Detector with Improved Accuracy and Linearity for High-Frequency Waveform Processing", 2007 IEEE International Symposium on Circuits and Systems, May 27-30, 2007, pp. 3884-3887, IEEE.

Richard, J.- F. et al., "High Voltage Interfaces for CMOS/DMOS Technologies", 2003, pp. 1-4.

Sedra, A. S. et al., "Microelectronic Circuits", 2010, pp. 190-191, 6th Edition, Oxford University Press, New York, US.

Boylestad, R. et al., "Electronic Devices and Circuit Theory", 2013, pp. 31-32, 11th Edition, Pearson.

\* cited by examiner

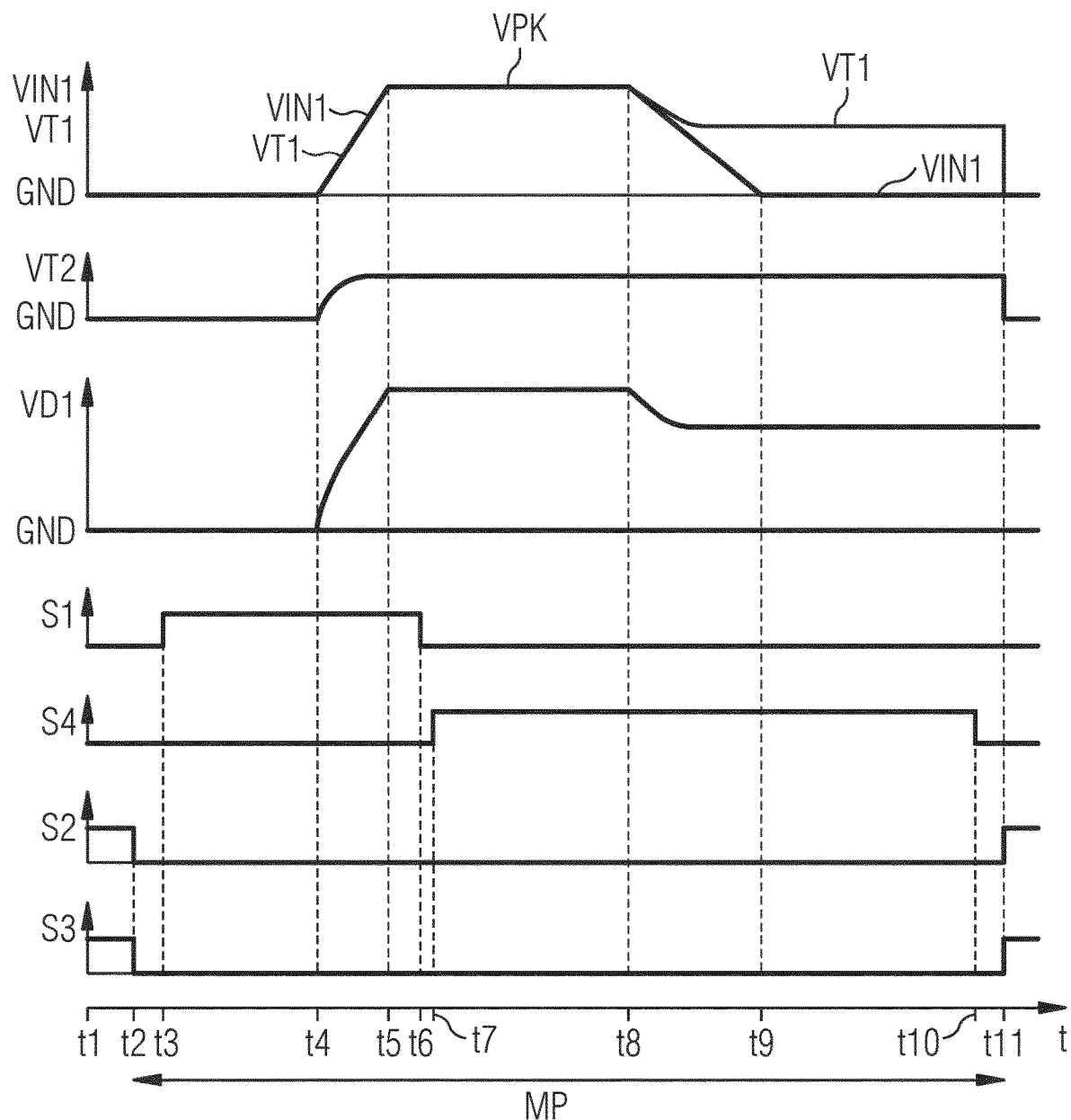

PEAK-DETECTOR CIRCUIT AND METHOD FOR EVALUATING A PEAK OF A FIRST INPUT VOLTAGE

CROSS-REFERENCE TO RELATED APPLICATION

The present application is a national stage entry according to 35 U.S.C. § 371 of PCT application No.: PCT/EP2020/081791 filed on Nov. 11, 2020, which claims priority to European Patent Application Serial No.: 19212174.7 filed on Nov. 28, 2019; both of which are incorporated herein by reference in their entirety and for all purposes.

TECHNICAL FIELD

The present disclosure is related to a peak-detector circuit, a current measurement arrangement with the peak-detector circuit, a light-detection-and-ranging system comprising the current measurement arrangement and a method for evaluating a peak of a first input voltage.

BACKGROUND

A peak-detector circuit is commonly configured to capture a peak value of a signal, especially of a voltage signal. Typically the peak value to be detected is positive to a reference potential. However, in some cases a peak value that is lower than the reference potential also has to be detected. To achieve a high accuracy for signal evaluation, the peak value has to be detected with high accuracy.

SUMMARY

In an embodiment, a peak-detector circuit comprises a first input terminal for providing a first input voltage, a first rectifying element with an anode connected to the first input terminal, a first capacitor with a first electrode connected to a cathode of the first rectifying element and a first terminal coupled to the first electrode of the first capacitor. Moreover, the peak-detector circuit comprises a second rectifying element with a cathode connected to the first input terminal, a second capacitor, a first switch coupling an anode of the second rectifying element to a first electrode of the second capacitor and a second terminal coupled to the first electrode of the second capacitor.

Advantageously, a first and a second terminal voltage can be tapped at the first and the second terminal. A value of a peak of the first input voltage can be determined using the first and the second terminal voltage. For example, the peak of the first input voltage may be equal to the sum of the first and the second terminal voltage.

In an embodiment, the peak-detector circuit further comprises a first discharge switch coupling the first electrode of the first capacitor to a reference potential terminal. Advantageously, the first capacitor can be discharged after a measurement.

In an embodiment, the peak-detector circuit further comprises a second discharge switch coupling the first electrode of the second capacitor to the reference potential terminal. Advantageously, the second discharge switch is configured to discharge the second capacitor after the measurement.

In an embodiment, the peak-detector circuit further comprises a first ground switch coupling the anode of the second rectifying element to the reference potential terminal. Advantageously, the first ground switch keeps the anode of the second rectifying element at a low voltage such that the first switch can be implemented as a low voltage switch.

In an embodiment, the first and the second rectifying element is realized as one of a group comprising a diode, a Schottky diode, a junction diode and a bipolar transistor connected in a diode configuration. The diode may be a pn-diode. Advantageously, the diode can easily be fabricated in a complementary metal-oxide-semiconductor technology (abbreviated CMOS technology). Advantageously, the Schottky diode has a low forward voltage drop.

In an embodiment, the peak-detector circuit further comprises an evaluation circuit. The evaluation circuit may include an adding circuit having a first input coupled to the first terminal, a second input coupled to the second terminal, and a first detector output for providing a first detector voltage. The first detector voltage may be a function of the sum of a first terminal voltage tapped at the first terminal and of a second terminal voltage tapped at the second terminal. Advantageously, the first detector voltage represents a peak of the first input voltage with high accuracy.

In an embodiment, the peak-detector circuit further comprises a second input terminal, a third rectifying element with an anode connected to the second input terminal, a third capacitor with a first electrode connected to a cathode of the third rectifying element and a third terminal coupled to the first electrode of the third capacitor. Furthermore, the peak-detector circuit comprises a fourth rectifying element with a cathode connected to the second input terminal, a fourth capacitor, a second switch coupling an anode of the fourth rectifying element to a first electrode of the fourth capacitor and a fourth terminal coupled to the first electrode of the fourth capacitor. Advantageously, a peak of a second input voltage tapped at the second input terminal can be detected with high accuracy.

In an embodiment, the third and the fourth rectifying element is realized as one of a group comprising a diode, a Schottky diode, a junction diode and a bipolar transistor connected in a diode configuration.

In an embodiment, the evaluation circuit of the peak-detector circuit comprises a first differential amplifier coupled on the input side to the first and the third terminal and on the output side to a first and a second detector output of the peak-detector circuit. The evaluation circuit comprises a second differential amplifier coupled on the input side to the second and the fourth terminal and on the output side to the first and the second detector output of the peak-detector circuit. By the first and the second differential amplifier, the first to the fourth terminal voltage tapped at the first to the fourth terminals can be evaluated to generate a first and a second detector voltage.

In an embodiment, the evaluation circuit generates a detector output signal between the first and the second detector output, e.g. by subtracting the sum of the third and the fourth terminal voltage from the sum of the first and the second terminal voltage. For example, the detector output signal has the form of a voltage.

In an embodiment, the first and the second differential amplifier are realized as transconductance amplifiers. Thus, the first and the second differential amplifier provide currents at their outputs. Typically, currents can be added more easily than voltages.

In an embodiment, the evaluation circuit comprises a common mode terminal and a first and a second resistor. The common mode terminal is coupled via the first resistor to the first detector output of the peak-detector circuit and via the second resistor to the second detector output of the peak-detector circuit.

In an embodiment, a current measurement arrangement comprises the peak-detector circuit and a shunt resistor that couples the first input terminal to the second input terminal of the peak-detector circuit. A current flows through the shunt resistor. The shunt resistor may be named measurement resistor. A peak of the current can be evaluated by the peak-detector circuit.

In an embodiment, a light-detection-and-ranging system, abbreviated as LIDAR system, comprises at least the current measurement arrangement, a light source, a driver for providing the current and a receiving arrangement. The current that flows through the shunt resistor drives the light source. Advantageously, the driver can be adjusted as a function of information about a previous peak that means as a function of e.g. the first detector voltage and/or the detector output signal and/or a digitized detector output signal. Moreover, the LIDAR system comprises a transmitting optics, wherein the light source emits light through the transmitting optics. The receiving arrangement includes at least a receiving optics and a photodetector. Furthermore, the LIDAR system may comprise a control circuit that may be coupled to the driver, the current measurement arrangement and the receiving arrangement. The LIDAR system may include further subsystems.

In an embodiment, a method for evaluating a peak of a first input voltage comprises:
  providing the first input voltage via a first input terminal to an anode of a first rectifying element, wherein a first electrode of a first capacitor is connected to a cathode of the first rectifying element,
  providing a first terminal voltage at a first terminal that is coupled to the first electrode of the first capacitor,
  providing the first input voltage via the first input terminal to a cathode of a second rectifying element, wherein a first switch couples an anode of the second rectifying element to a first electrode of a second capacitor, and
  providing a second terminal voltage at a second terminal that is coupled to the first electrode of the second capacitor.

Advantageously, the second terminal voltage can be used to determine a peak value of the first input voltage together with the first terminal voltage.

The method for evaluating a peak of a first input voltage may be implemented e.g. by a peak-detector circuit, a current measurement arrangement or a light-detection-and-ranging system according to one of the embodiments defined above.

The peak-detector circuit is configured for pulse-shaped signals, especially pulse-shaped voltages. The peak-detector circuit is configured to capture the peak value of a signal such as the first or the second input voltage. The peak-detector circuit may be used with, but not exclusive to, high-voltage pulse-shaped signals in a driver of a LIDAR system. Alternatively, the peak-detector circuit may be used for protection of power transistors (limitation by the peak current/voltage), for envelope detectors or for automatic gain control.

The peak-detector circuit is able to measure the peak value of pulses in nano-seconds range, e.g. under high voltage environment. The two requirements, short pulses and high voltage, are additionally weighted by the need to interface low-voltage circuits providing control.

In an embodiment, a method may comprise the steps of the method for evaluating the peak of the first input voltage and further steps for evaluating a peak of the second input voltage.

BRIEF DESCRIPTION OF THE DRAWINGS

The following description of figures of embodiments may further illustrate and explain aspects of the peak-detector circuit, the current measurement arrangement, the LIDAR system and the method for evaluating a peak of a first input voltage. Devices and circuit parts with the same structure and the same effect, respectively, appear with equivalent reference symbols. In so far as devices or circuit parts correspond to one another in terms of their function in different figures, the description thereof is not repeated for each of the following figures.

FIGS. 2A and 2B shows an example of a peak-detector circuit and of signals detected at such a peak-detector circuit;

DETAILED DESCRIPTION

Figure 1:
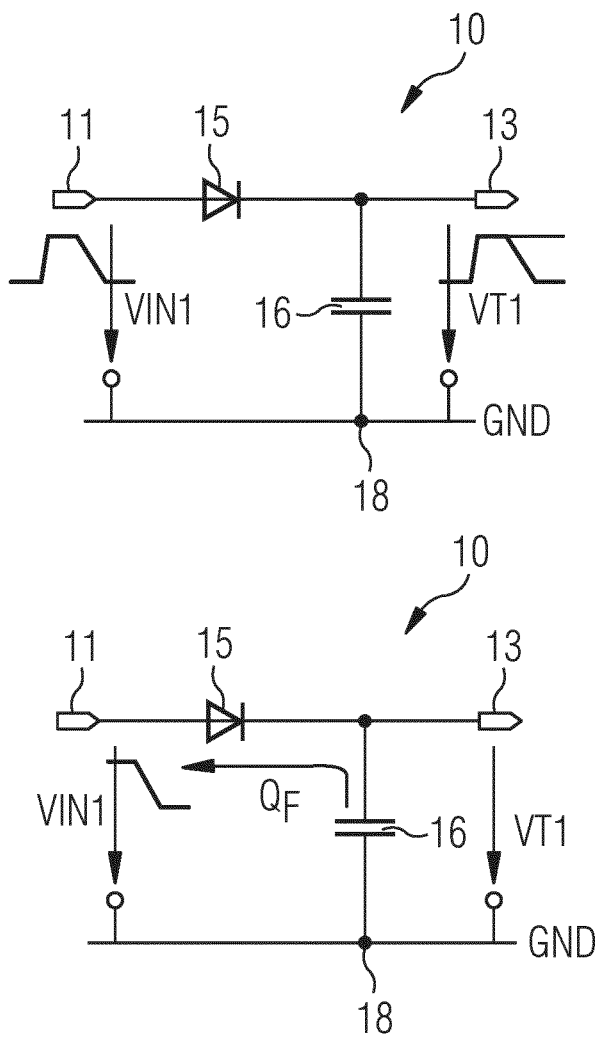
FIG. 1 shows an example of a conventional peak-detector circuit and of signals at the peak-detector circuit.
Figure 1:
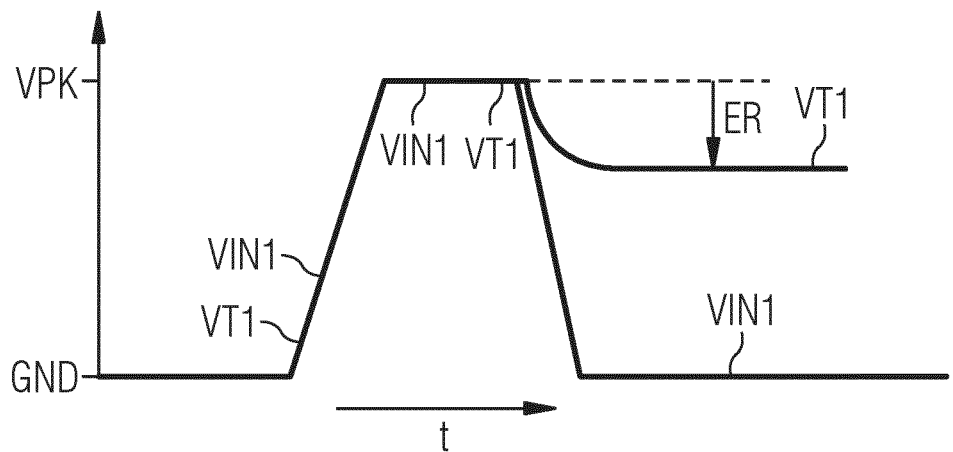

FIG. 1 shows an example of a conventional peak-detector circuit 10. The peak-detector circuit 10 comprises a first input terminal 11, a first terminal 13, a first rectifying element 15 and a first capacitor 16. Moreover, the peak-detector circuit 10 comprises a reference potential terminal 18. The first input terminal 11 is coupled to the first electrode of the first capacitor 16 via the first rectifying element 15. The first electrode of the first capacitor 16 is coupled to the first terminal 13. The second electrode of the first capacitor 16 is coupled to the reference potential terminal 18.

More specifically, the first rectifying element 15 may be implemented as a diode, especially as a junction diode. An anode of the first rectifying element 15 is directly and permanently connected to the first input terminal 11. A cathode of the first rectifying element 15 is directly and permanently connected to the first electrode of the first capacitor 16. The first electrode of the first capacitor 16 is directly and permanently connected to the first terminal 13. The second electrode of the first capacitor 16 is directly and permanently connected to the reference potential terminal 18.

A reference potential GND is tapped at the reference potential terminal 18. A first input voltage VIN1 is applied to the first input terminal 11. At the first terminal 13, a first terminal voltage VT1 can be tapped. The first input voltage VIN1 and the first terminal voltage VT1 are measured with respect to the reference potential GND.

As shown in lower part of FIG. 1, the first input voltage VIN1 shows a pulse with a small rising time and a small decay time. As indicated by the dotted lines in the lower part of FIG. 1, the first terminal voltage VT1 should have the maximum value of the first input voltage VIN1 that is the peak value VPK of the pulse of the first input voltage VIN1.

However, as indicated in the middle part of FIG. 1, in the period during which the first input voltage VIN1 drops, a charge QF flows backwards to the first input terminal 11. The origin of the charge QF is the flow of charge carriers in the first rectifying element 15 which have to be removed to generate the depletion region inside the first rectifying element 15. These charge carriers result in a drop of the first terminal voltage VT1 and thus in an error ER.

The error ER is the difference between the peak value VPK of the first input voltage VIN1 and the first terminal voltage VT1 after the drop of the first input voltage VIN1, especially at the end of the pulse. Further errors, not shown here, may be results of a threshold voltage of the first rectifying element 15 such as a minimum forward voltage.

The peak-detector circuit 10 capturing the maximum (which is the peak VPK) of the first input voltage VIN1 operates as follows: Generally, the peak-detector circuit 10 includes the first rectifying element 15 and the first capacitor 16 that has the function of a storage element and is realized as a hold capacitor. The advantage of the peak-detector circuit 10 lies in the fact that the peak value VPK remains stored in the first capacitor 16 relieving the timing requirements to capture short pulses, e.g. fast control level-shifted signals used to operate a double diffused MOS transistor (abbreviated as DMOS transistor).

In its conventional implementation as shown in FIG. 1, featuring a pn-junction diode as the first rectifying element 15, the classic peak-detector circuit 10 suffers from the reverse-recovery effect (RRE) when the first rectifying element 15 changes biasing from forward to reverse. It is due to mobile charge existing in the junction of the first rectifying element 15 that needs to be cleared for the first rectifying element 15 to stop conducting when the reverse-bias conditions are met. This charge QF is taken from the first capacitor 16, reducing its voltage and creating a "down-step" seen as the error ER. The same effect results in a reverse-recovery time.

The peak-detector circuit 10 of FIG. 1 may exhibit additional problems giving rise to errors and nonlinearity. These problems may include: a variable input impedance; a diode turn-on voltage makes the circuit insensitive to signal levels below it, also making it inaccurate by this turn-on voltage (likewise its variation, e.g. temperature and process variation); and a rate of signal change.

Figure 2A:
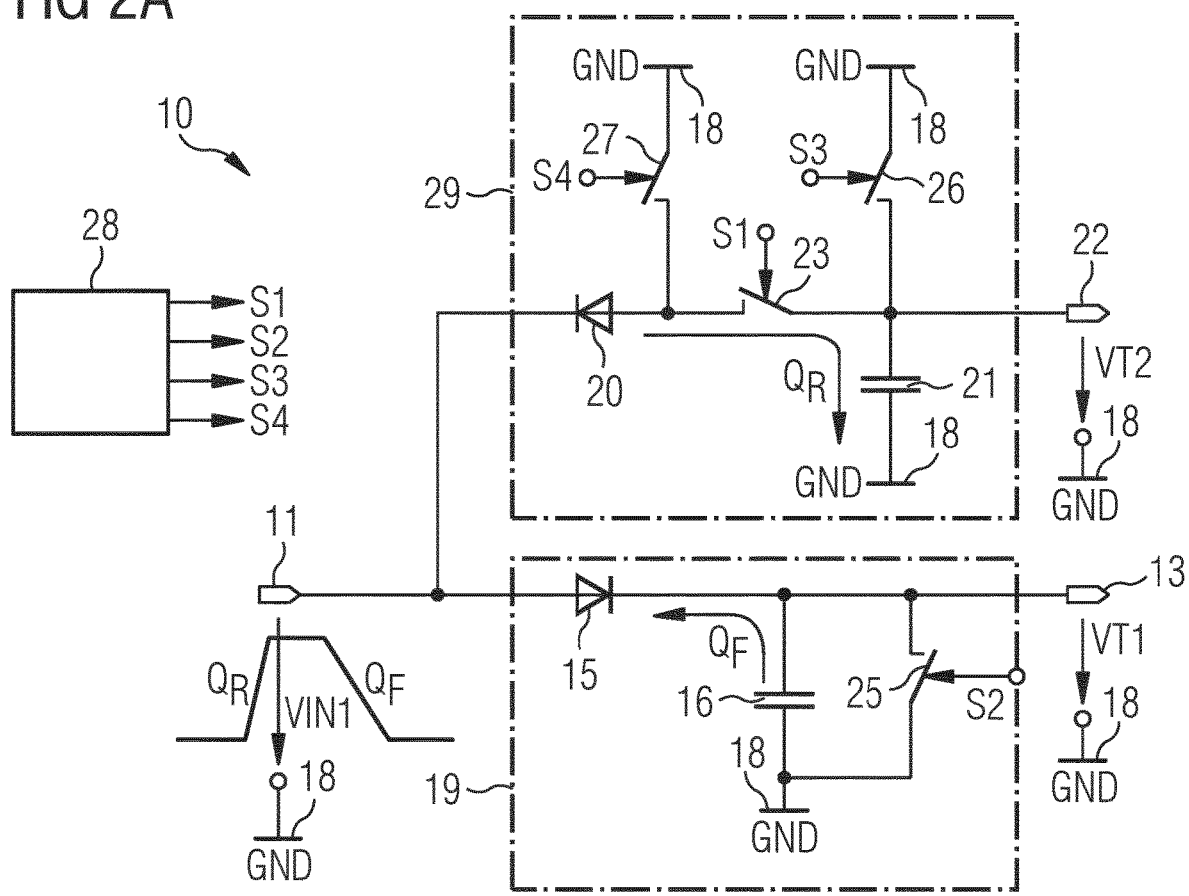

FIG. 2A shows a further example of the peak-detector circuit 10 which is a further development of the example shown in FIG. 1. The peak-detector circuit 10 further comprises a second rectifying element 20, a second capacitor 21 and a second terminal 22. The second rectifying element 20 couples the first input terminal 11 to a first electrode of the second capacitor 21. The first electrode of the second capacitor 21 is coupled to the second terminal 22. Moreover, the peak-detector circuit 10 comprises a first switch 23 coupling the second rectifying element 20 to the first electrode of the second capacitor 21. A second electrode of the second capacitor 21 is coupled to the reference potential terminal 18.

More specifically, a cathode of the second rectifying element is directly and permanently connected to the first input terminal 11. An anode of the second rectifying element 20 is coupled via the first switch 23 to the first electrode of the second capacitor 21. The first electrode of the second capacitor 21 is directly and permanently connected to the second terminal 22. The second electrode of the second capacitor 21 is directly and permanently connected to the reference potential terminal 18.

The first and the second rectifying element 15, 20 are both connected to the first input terminal 11. However, the second rectifying element 20 is oriented in the reverse direction with respect to the first rectifying element 15. The second rectifying element 20 may be a diode, especially as a junction diode.

Moreover, a first discharge switch 25 of the peak-detector circuit 10 couples the first electrode of the first capacitor 21 to the reference potential terminal 18. A second discharge switch 26 of the peak-detector circuit 10 couples the first electrode of the second capacitor 21 to the reference potential terminal 18. A first ground switch 27 of the peak-detector circuit 10 couples a node between the second rectifying element 20 and the first switch 23 to the reference potential terminal 18. Thus, the anode of the second rectifying element 20 is coupled via the first ground switch 27 to the reference potential terminal. A second terminal voltage VT2 is provided at the second terminal 22. Moreover, a control circuit 28 is coupled to the control terminal of the switches 23, 25, 26, 27 by not shown connection lines.

Thus, the peak-detector circuit 10 comprises a main circuit 19 and a supplementary circuit 29 which are both connected on their input sides to the first input terminal 11. The main circuit 19 includes the first rectifying element 15, the first capacitor 16, the first discharge switch 25 and the first terminal 13. The supplementary circuit 29 includes the second rectifying element 20, the second capacitor 21, the first switch 23, the second discharge switch 26, the first ground switch 27 and the second terminal 22.

In an alternative embodiment, not shown, the first and the second rectifying element 15, 20 is realized as a Schottky diode, a junction diode or a bipolar transistor connected in a diode configuration.

FIG. 2B shows an example of signals of the peak-detector circuit of FIG. 2A. In FIG. 2B, the first input voltage VIN1, the first terminal voltage VT1, the second terminal voltage VT2, a first detector voltage VD1 and a first to a fourth control signal S1 to S4 are shown as a function of a time t. The first input voltage VIN1 shows a pulse with a small rising time and a small drop time. The pulse of the first input voltage VIN1 has a peak value VPK. The first terminal voltage VT1 rises corresponding to the first input voltage VIN1. At the drop of the first input voltage VIN1, the first terminal voltage VT1 also has a small drop as explained above. The second terminal voltage VT2 rises at the rise of the first input voltage VIN1. At the drop of the first input voltage VIN1 there is no drop of the second terminal voltage VT2. The control signals S1 to S4 are generated by the control circuit 28.

The pulse of the first input voltage VIN1 may have a duration of less than 15 ns, alternatively of less than 10 ns or potentially of less than 5 ns.

The first control signal S1 controls the first switch 23. The first discharge switch 25 is controlled by the second control signal S2. The second discharge switch 26 is controlled by the third control signal S3. The fourth control signal S4 controls the first ground switch 27. The second control signal S2 and the third control signal S3 may be equal and be replaced by one control signal.

Between a first point of time t1 and a second point of time t2 which follows the first point of time t1, the second and the third control signal S2, S3 set the first and the second discharge switch 25, 26 in a conducting state. Thus, the first and the second terminal voltage VT1, VT2 are set to zero, that means the first and the second terminal voltage VT1, VT2 obtain the ground potential GND. At the second point of time t2, the first and the second discharge switch 25, 26 are set in a non-conducting state by the second and the third control signal S2, S3. These two switches remain in a non-conducting state during a measurement period MP.

Between the first point of time t1 and a third point of time t3, the first control signal S1 sets the first switch 23 in a non-conducting state. The third point of time t3 follows the second point of time t2. At the third point of time t3, the first switch 23 is set in a conducting state by the first control signal S1. By this change, the peak-detector circuit is set in a state configured to detect a peak in the first input voltage VIN1. At a fourth point of time t4 that follows the third point of time t3, the first input VIN1 starts to rise, resulting in a rise of the first terminal voltage VT1. The rise ends at a fifth point of time t5.

Before the fourth point of time t4, the anode and the cathode of the second rectifying element 20 have nearly the same potential, namely the ground potential GND. The rise of the first input voltage VIN1 that is applied to the cathode of the second rectifying element 20 generates a depletion region in the second rectifying element 20. Thus, charge carriers flow from the second rectifying element 20 via the first switch 23 (being in a conducting state) to the first electrode of the second capacitor 21. Therefore, the second terminal voltage VT2 rises as can be seen in FIG. 2B.

Figure 6:
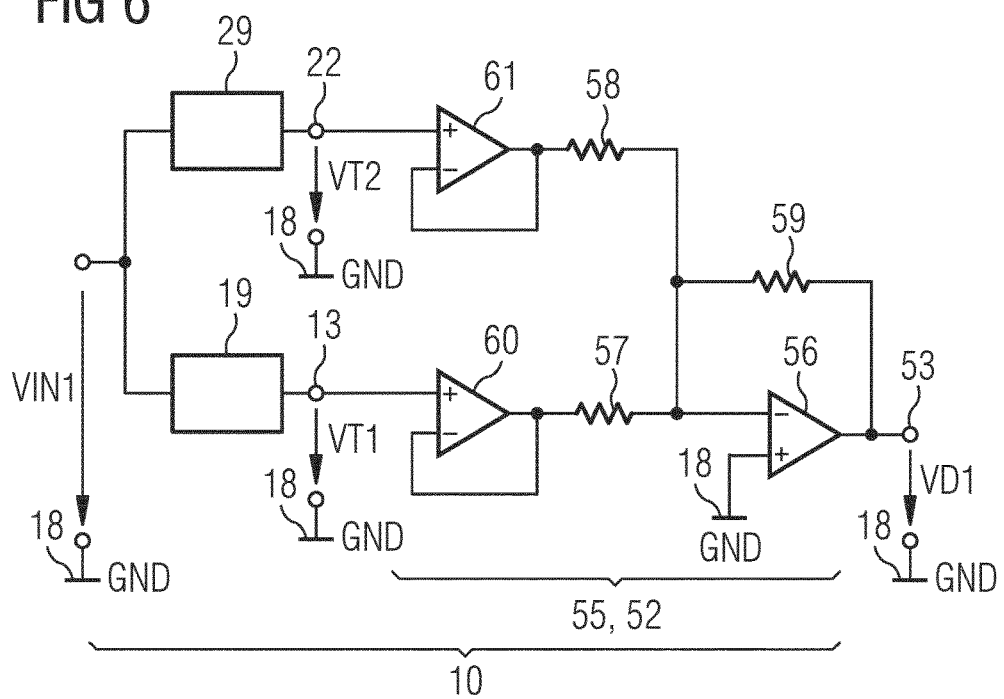
FIG. 6 shows an example of a peak-detector circuit with an evaluation circuit.
Figure 7:
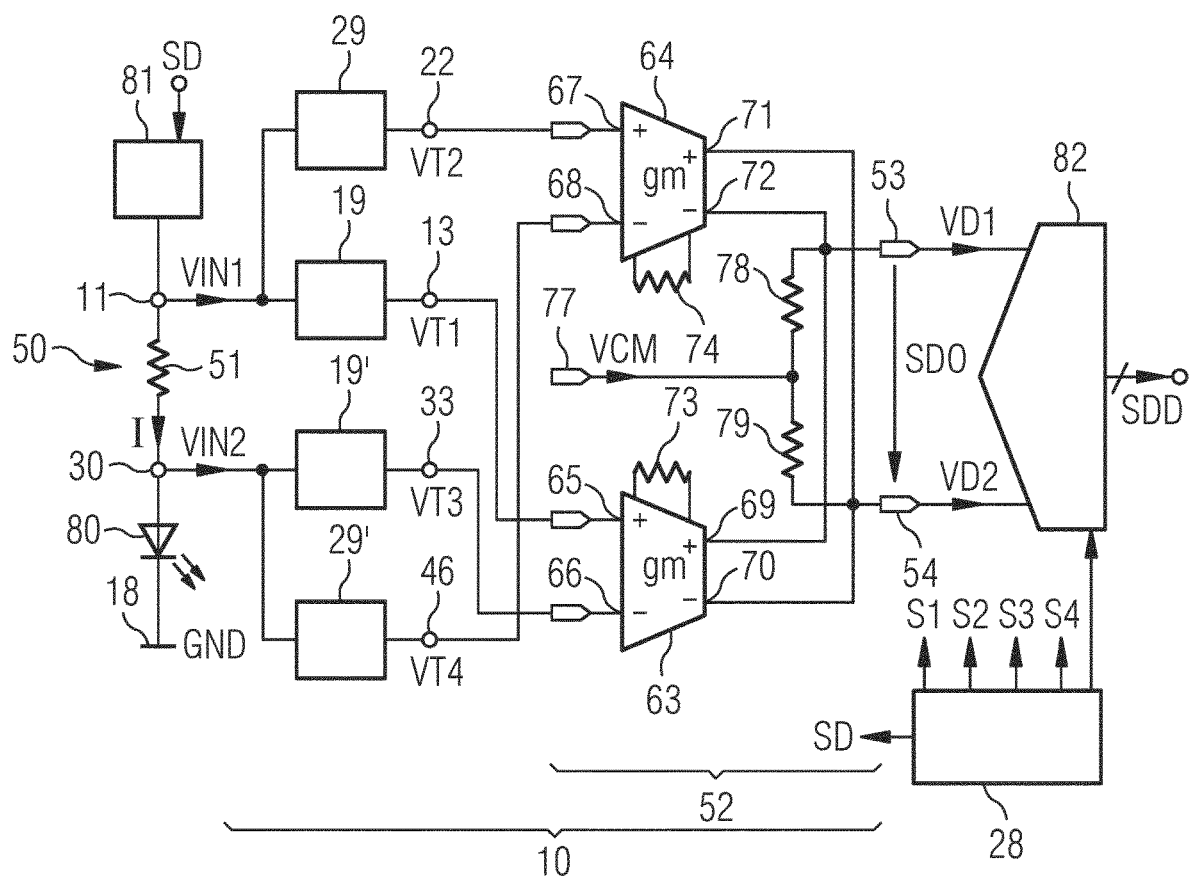
FIG. 7 shows an example of a current measurement arrangement having a peak-detector circuit.

At a sixth point of time t6, after the fifth point of time t5, the first switch 23 is set in a non-conducting state by the first control signal S1. Thus, any flow of charge from the second capacitor 21 in the direction of the second rectifying element 20 is avoided. In a seventh point of time t7, following the sixth point of time t6, the fourth control signal S4 sets the first ground switch 27 in a conducting state. Up to the seventh point of time t7, the first ground switch 27 has been in a non-conducting state. The first input voltage VIN1 drops between an eighth point of time t8 and a ninth point of time t9. The first terminal voltage VT1 shows a small drop after the seventh point of time t7. A first detector voltage VD1 may be a function of the first and the second terminal voltage VT1, VT2. The first detector voltage VD1 may be generated by an evaluation circuit, not shown in FIG. 2A (examples are shown in FIGS. 6 and 7). The first detector voltage VD1 may be the sum of the first and the second terminal voltage VT1, VT2. The first detector voltage VD1 now has the value of the peak of the first input voltage VIN1. Thus, after the ninth point of time t9, the first detector voltage VD1 can be evaluated by an evaluation circuit connected to the output side of the peak-detector 10, namely connected to the first and the second terminal 13, 22.

At a tenth point of time t10, the fourth control signal S4 sets the first ground switch 27 in a non-conducting state. At a eleventh point of time t11, the second and the third control signal S2, S3 set the first and second discharge switch 25, 26 in a conducting state to provide the ground potential GND to the first electrodes of the first and the second capacitor 16, 21. The evaluation of the first detector voltage VD1 can be performed between the ninth point of time t9 and the eleventh point of time t11.

In an embodiment, the capacitance values of the first and the second capacitor 16, 21 are equal. Moreover, the first and the second rectifying element 15, 20 are realized by two structures that are identical. Thus, the value of the second terminal voltage VT2 between the ninth and the tenth point of time t9, t10 is equal to the drop of the first terminal voltage VT1 after the eighth point of time t8. Thus, by adding the first terminal voltage VT1 and the second terminal voltage VT2, the first detector voltage VD1 obtains the peak value VPK of the first input voltage VIN1 with high accuracy. Advantageously, the peak-detector circuit 10 addresses at least one inherent problem of the classic peak-detector mentioned above. Since the peak-detector circuit 10 uses a differential approach and available diodes for an integrated circuit, the amount of error can be recreated. It can be then used to correct the voltage itself leading to approved accuracy and linearity. As a remedy, shown in FIGS. 2A and 2B, the supplementary circuit 29 is attached to recreate the amount of error which can be posteriori used to correct the first terminal voltage VT1. The supplementary circuit 29 is configured as an error-recreating supplementary circuit.

For simplicity, the analysis that follows is shown for the peak-detector circuit 10 illustrated in FIG. 2A. In the same fashion, the analysis can be extended to the other half of the circuit shown in FIGS. 3 and 4A.

Noting that because of the reverse biasing of the first rectifying element 15 (caused by the drop of the first input voltage VIN1) the charge QF is taken from the first capacitor 16 creating the error ER (equation 1)—the shortcoming of the classic peak-detector shown in FIG. 1. The charge QF can be named charge loss, is due to the reverse recovery effect of the first rectifying element 15 and depends mainly on the characteristics of the first rectifying element 15 and the reverse voltage it is subjected to.

$$VT1=VPK-QF/CS \qquad \text{(equation 1)},$$

wherein VT1 is a value of the first terminal voltage, VPK is a peak value of the first input voltage VIN, QF is a value of the charge and CS is a capacitance value of the first capacitor 16. The error ER is equal to QF/CS.

The supplementary circuit 19 is used in the way to create the reverse biasing condition at the second rectifying element 20, same as seen by the first rectifying element 15. It is assumed that the first and the second capacitor 16, 21 are discharged beforehand. In effect, due to the reverse recovery effect on the second rectifying element 20, the second capacitor 21 is charged with a charge QR during the rising edge of the first input voltage VIN1.

$$VT2=QR/CSE \qquad \text{(equation 2)};$$

wherein VT2 is a value of the second terminal voltage, QR is a value of charge that flows to the second capacitor 21 and CSE is a capacitance value of the second capacitor 21.

The matched characteristics of the two rectifying elements 15, 20 and their identical reverse-biasing condition result in the identity of reverse-recovery charge for both rectifying elements 15, 20 (equation 3).

$$QF=QR \qquad \text{(equation 3)}$$

The first and the second capacitors 16, 21 may have equal capacitance values, resulting in CS=CSE. Since the first and the second capacitors 16, 21 are matched, the second terminal voltage VT2 at the second capacitor 21 corresponds to the error ER caused by the charge QF being subtracted from the first capacitor 16. Therefore, referring to FIG. 2B, from equation 1, 2 and 3, the sum of first and the second terminal voltage VT1, VT2 equals to the peak voltage VPK and thus to the first detector voltage VD1.

$$VT1+VT2=VPK=VD1 \qquad \text{(equation 4)}$$

To facilitate the described operation, the non-overlapping switch control signals S1, S4 for the first switch 23 and the first ground switch 27 are set to allow reverse biasing of the second rectifying element 20 with the rising edge of the pulse but prevent discharging of the second capacitor 21 during the falling edge (FIG. 2B). All switches 23, 25, 26, 27 are controllable from low voltage domain. The first and the second discharge switch 25, 26 discharge the first and the second capacitor 16, 21 before the next pulse. The peak-detector circuit 10 of FIG. 2A recreates the error ER (a half of an optional differential implementation is shown).

Figure 3:
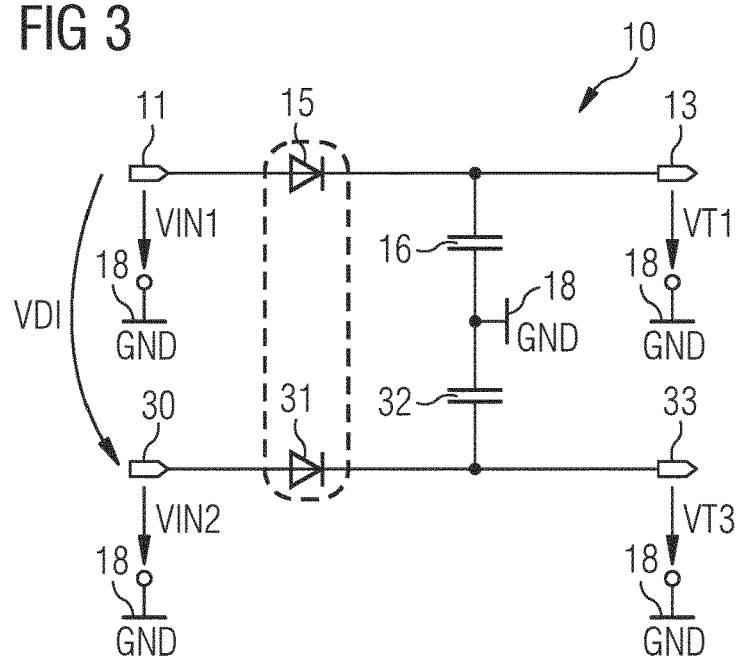
FIG. 3 shows an example of a peak-detector circuit for peaks which have a positive or a negative value with respect to a reference potential.

FIG. 3 shows a further example of the peak-detector circuit which is a further development of the examples shown in FIGS. 1 and 2A. Thus, the circuit 10 of FIG. 3 is based on the conventional peak-detector shown in FIG. 1. The peak-detector circuit 10 comprises a second input terminal 30, a third rectifying element 31, a third capacitor 32 and a third terminal 33. The second input terminal 30 is coupled via the third rectifying element 31 to a first electrode of the third capacitor 32. The first electrode of the third capacitor 32 is coupled to the third terminal 33. Moreover, a second electrode of the third capacitor 32 is coupled to the reference potential terminal 18. The third rectifying element 31 is realized as a diode.

More specifically, an anode of the third rectifying element 31 is directly and permanently connected to the second input terminal 30. A cathode of the third rectifying element 31 is directly and permanently connected to the first electrode of the third capacitor 32. The second electrode of the third capacitor 32 is directly and permanently connected to the reference potential terminal 18. The first electrode of the third capacitor 32 is directly and permanently connected to the third terminal 33.

A second input voltage VIN2 is provided to the second input terminal 30. A third terminal voltage VT3 is tapped at the third terminal 33. A pulse of the second input voltage VIN2 results in a pulse of the third terminal voltage VT3. Especially, a pulse having a peak value that is positive with respect to the reference potential GND results in charging the third capacitor 32 via the third rectifying element 31 and thus results in the third terminal voltage VT3 having a value that is positive with respect to the reference potential GND after the peak detection.

The first and the second input voltage VIN1, VIN2 form a differential input voltage VDI. Given the differential input voltage VDI, the classic peak-detector 10 from FIG. 1 is extended to differential implementation seen in FIG. 3. Based on the argument of matching, the first and the second rectifying elements 15, 31 exhibit similar electrical characteristics in effect lessening the error coming from turn-on voltage (and its implications). However, the reverse recovery effect is not entirely addressed by differential approach illustrated by FIG. 3. This is because the first and the second input voltages VIN1, VIN2 differ by the differential input voltage VDI and therefore the two rectifying elements 15, 31 exhibit slightly different reverse recovery effects leaving residual nonlinear error behind.

Figure 4A:
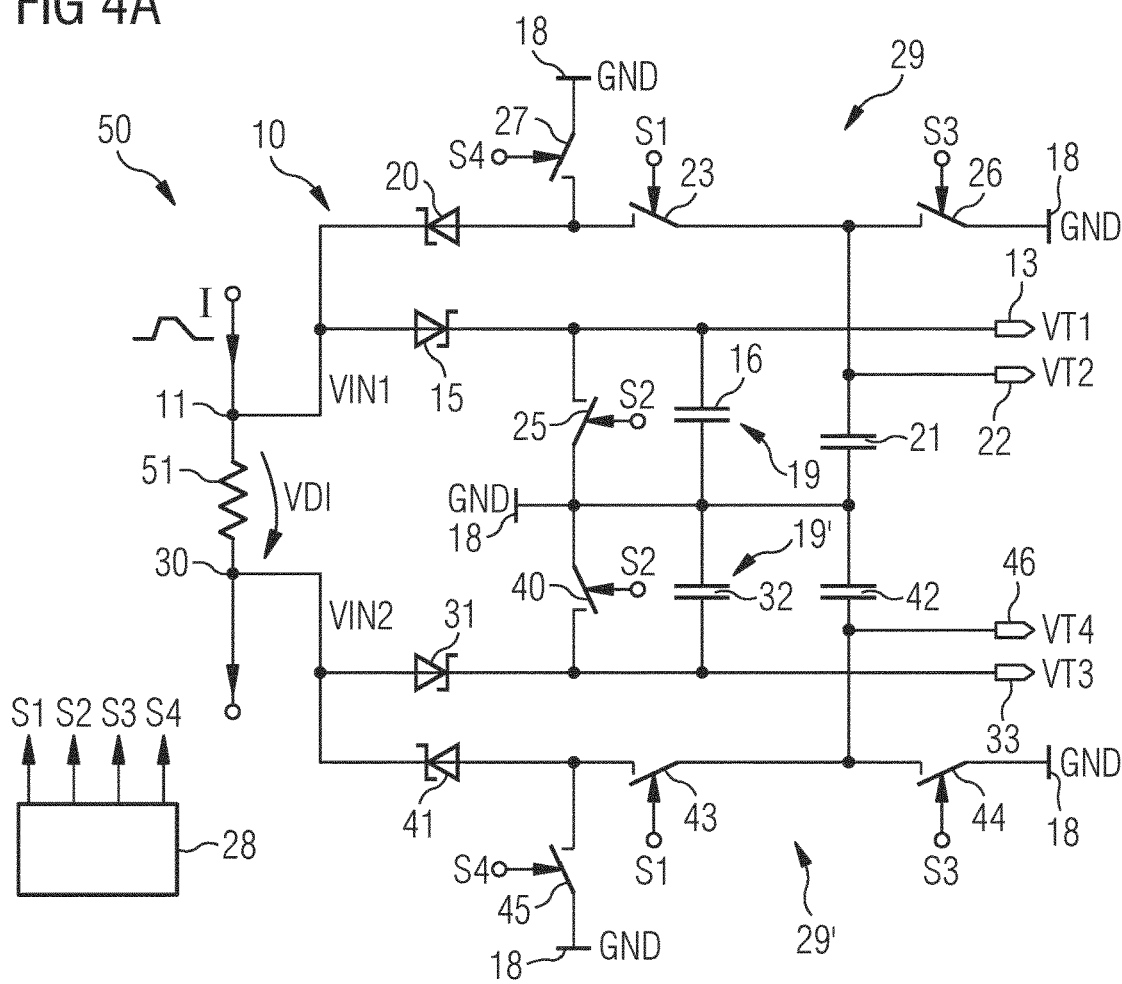
FIGS. 4A and 4B shows an example of a current measurement arrangement with a peak-detector circuit and the corresponding signals.

FIG. 4A shows a further example of the peak-detector circuit 10 which is a further development of the peak-detector circuit 10 shown above. The peak-detector circuit 10 comprises the first and the second rectifying element 15, 20, the first and the second capacitor 16, 21 and the first and the second terminal 13, 22 as shown in FIG. 2A. Moreover, the peak-detector circuit 10 of FIG. 4A also comprises the first and second discharge switch 25, 26 and the first ground switch 27 shown in FIG. 2A. Moreover, the peak-detector circuit 10 comprises the second input terminal 30, the third rectifying element 31, the third capacitor 32 and the third terminal 33 as shown in FIG. 3.

Furthermore, the peak-detector circuit 10 comprises a third discharge switch 40 coupling a node between the third rectifying element 31 and the third capacitor 32 to the reference potential terminal 18. More specifically, a cathode of the third rectifying element and thus also the first electrode of the third capacitor 32 are coupled via the third discharge switch 40 to the reference potential terminal 18.

Moreover, the peak-detector circuit 10 comprises a fourth rectifying element 41 and a fourth capacitor 42. The fourth rectifying element 41 couples the second input terminal 30 to the fourth capacitor 42. Additionally, the peak-detector circuit 10 comprises a second switch 43 coupling the rectifying element 41 to a first electrode of the fourth capacitor 42. Moreover, a cathode of the fourth rectifying element 41 is coupled to the second input terminal 30. An anode of the fourth rectifying element 41 is coupled via the second switch 43 to the first electrode of the fourth capacitor 42. The first electrode of the fourth capacitor 42 is coupled to a fourth terminal 46 of the peak-detector circuit 10. A second electrode of the fourth capacitor 42 is coupled to the reference potential terminal 18.

Specifically, a cathode of the fourth rectifying element 41 is directly and permanently connected to the second input terminal 30. The first electrode of the fourth capacitor 42 is directly and permanently connected to a fourth terminal 46 of the peak-detector circuit 10. The second electrode of the fourth capacitor 42 is directly and permanently connected to the reference potential terminal 18.

A fourth discharge switch 44 of the peak-detector circuit 10 couples the first electrode of the fourth capacitor 42 to the reference potential terminal 18. A second ground switch 45 couples a node between the fourth rectifying element 41 and the second switch 43 to the reference potential terminal 18.

The peak-detector circuit 10 comprises a further main circuit 19' and a further supplementary circuit 29'. The further main circuit 19' includes the third rectifying element 31, the third capacitor 32, the third discharge switch 40 and the third terminal 33. The further supplementary circuit 29' includes the fourth rectifying element 41, the fourth capacitor 42, the second switch 43, the fourth discharge switch 44, the second ground switch 45 and the fourth terminal 46. The further main circuit 19' and the further supplementary circuit 29' are both connected on their input sides to the second input terminal 30.

At the fourth terminal 46, the fourth terminal voltage VT4 can be tapped. A second detector voltage VD2 may be generated by an evaluation circuit, not shown in FIG. 4A (examples are shown in FIGS. 6 and 7). The second detector voltage VD2 may be a function of the third and the fourth terminal voltage VT3, VT4. The second detector voltage VD2 may be the sum of the third and the fourth terminal voltage VT3, VT4 and may obtain a value of a peak of the second input voltage VIN2.

The peak-detector circuit 10 is included in a current measurement arrangement 50. Thus, the current measurement arrangement 50 comprises the peak-detector circuit 10 and a shunt resistor 51. The shunt resistor 51 may be realized as a measurement resistor. The shunt resistor 51 couples the first input terminal 11 to the second input terminal 30. A current I flows through the shunt resistor 51. Thus, the differential input voltage VDI and the first and the second input voltage VIN1, VIN2 can be calculated as follows:

$$VDI = VIN1 - VIN2 = RM \cdot I,$$

wherein VDI is a value of the differential input voltage, VIN1 and VIN2 are values of the first and the second input voltage, RM is a resistance value of the shunt resistor 51 and I is a value of the current that flows through the shunt resistor 51.

Figure 4B:
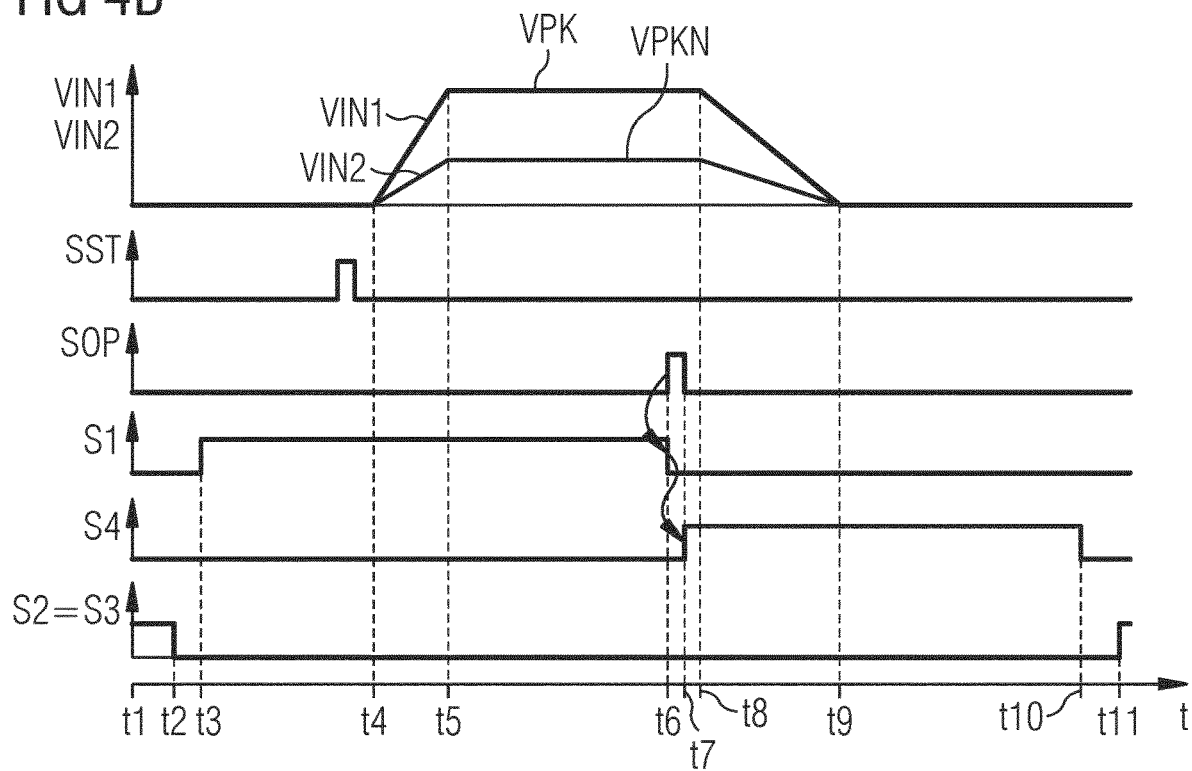

FIG. 4B shows an example of signals of the current measurement arrangement 50 of FIG. 4A. The upper part and the lower part of the peak-detector circuit 10 are shown in FIG. 4A. Both parts detect pulses which are positive with respect to the reference potential GND. The first and the second switch 23, 43 are both controlled by the first control signal S1. The first and the second discharge switch 25, 26 are both controlled by the second control signal S2. The first and the second ground switch 27, 45 are both controlled by the fourth control signal S4. Also the third and the fourth discharge switch 44, 45 are both controlled by the fourth control signal S4.

Moreover, a pulse start signal SST is generated before the pulse of the first and second input voltage VIN1, VIN2. A pulse stop signal SOP is generated during the pulse of the first and the second input voltage VIN1, VIN2. The pulse stop signal SOP triggers a change in the first and fourth control signal S1, S4 during the pulse.

The following assumptions may be applied: the two input voltages VIN1, VIN2 have voltage values being high enough to open the first and the third rectifying element 15, 31; the voltage levels of the input voltages VIN1, VIN2 before and after the pulse are equal; and a differential approach is applicable. The limitations of a classic peak-detector (in particular due to turn-on voltage and reverse recovery effect) are addressed by differential approach complemented by the supplementary circuits 29, 29' to generate the amount of reverse recovery effect error for signal correction.

The peak-detector circuit 10 may be suitable for integrated circuit implementation and high voltage environment to capture short pulses. The strategy to answer the challenge of capturing short pulses is shifted from the pulse itself to the time between pulses thus relaxing the dynamic requirement to capture the pulse (e.g. open a high voltage switch), given that duty-cycle is low. The peak-detector circuit 10 may be fabricated on one semiconductor body. The peak-detector circuit 10 may be integrated on a surface of the semiconductor body.

To capture amplitude of short high-voltage pulses, using the peak-detector circuit 10 is surely an advantage as eliminates the need for level-shifted control to operate switches. In fact, all control is done from the low voltage-domain. It does not use a feedback-aided solution requiring high bandwidth amplifiers operating at high voltage.

An example of the peak-detector circuit 10 as shown in FIG. 4A uses integrated circuit Schottky diodes as rectifying elements 15, 20, 31, 41. It tackles with measurement of the actual pulsed-current being delivered to load (laser, e.g. VCSEL) for monitoring the delivered energy for (eye) safety in a light-detection-and-ranging system, abbreviated as a LIDAR system. The first to the fourth rectifying elements 15, 20, 31, 41 may be fabricated as Schottky diodes, especially as integrated Schottky diodes or integrated circuit Schottky diodes. The semiconductor body of the peak detector circuit includes the first to the fourth rectifying element 15, 20, 31, 41. Thus, integrated Schottky diode or integrated circuit Schottky diode means a Schottky diode fabricated on this semiconductor body. Schottky diodes alone do not suffer from reverse recovery effects. However, Schottky diodes implemented in integrated technique have a parasitic pn-junction diode which in turn have the reverse recovery effect. The integrated circuit Schottky diodes have parasitic pn-junction diodes.

The pulse is controllable by the pulse start signal SST and the pulse stop signal SOP; there is a low voltage control signal between rise and fall edge of the pulse of the current I to prevent the first to the fourth capacitor 16, 21, 32, 42 from discharging; there is sufficient matching between the first to the fourth rectifying element 15, 20, 31, 41 realized by pn-junction diodes or Schottky diodes; the peak values VPK and VPKN are sufficient to overcome the Schottky diode turn-on voltage.

The shunt resistor 51 creates the differential input voltage VDI proportional to the current I being measured. The peak value of the voltage drop VDI across the shunt resistor 51 is stored at the first and the third capacitor 16, 32.

In this implementation, the only high-voltage required components, besides the diodes 15, 20, 31, 41 and the capacitors, are the ground switches 27, 45. They may be implemented as DMOS transistors but, as others, are controllable from low voltage domain therefore omitting voltage follower for its gate-to-source voltage.

After the pulse of the current I, the relation given by equation 5 is valid.

$$VPK-VPKN=(VT1-VT3)+(VT2-VT4) \quad \text{(equation 5)}$$

In other words, the peak voltage drop across the shunt resistor 51 equals to the sum of differential voltages across the first to the fourth capacitors 16, 21, 32, 42.

Figure 5:
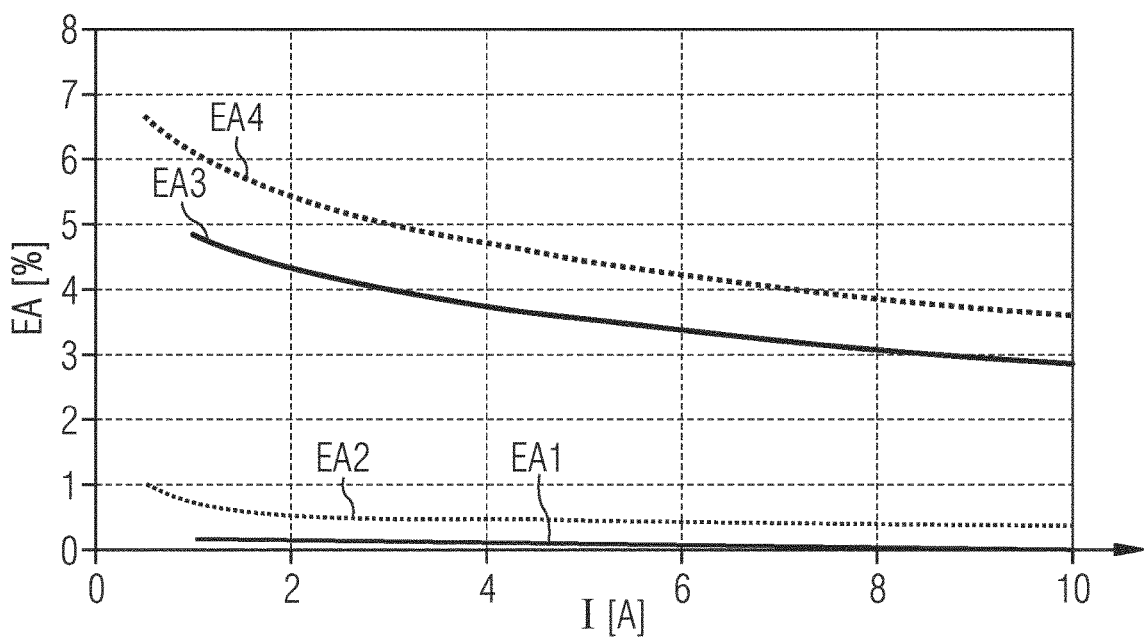
FIG. 5 shows an example of characteristics of peak-detector circuits.

FIG. 5 shows an example of characteristics of the peak-detector circuit 10 as shown in one of the embodiments above. In particular, a comparison between a conventional and an example of a proposed peak-detector (i.e. FIG. 3 and FIG. 4A) is illustrated by FIG. 5. An error EA is shown as a function of the current I. There are four lines marked with EA1 to EA4. EA1 represents typical values and EA2 represents the worst corner of an example of the peak-detector circuit as shown in FIG. 4A. EA3 represents typical values and EA4 represents the worst corner of an example of a classic peak-detector circuit 10 as shown in FIG. 3. The error EA decreases with increasing current I. A comparison in terms of error EA is made between classic peak-detector (FIG. 3) and the improved peak-detector (FIG. 4A). The results in FIG. show an evident improvement in terms of error EA and linearity.

The error EA refers to an absolute current measurement. The error EA is given as a relative error. The error EA3 and EA4 of the circuit 10 of FIG. 3 is determined as follows:

$$EA = 100\% \cdot \left[ \frac{VT1 - VT3}{I \cdot RM} - 1 \right]$$

wherein the first and the third terminal voltage VT1, VT3 are taken between the ninth point of time t9 and the tenth point of time t10. The error EA1 and EA2 of the circuit 10 of FIG. 4A is determined as follows:

$$EA = 100\% \cdot \left[ \frac{(VT1 - VT3) + (VT2 - VT4)}{I \cdot RM} - 1 \right]$$

wherein the first to the fourth terminal voltage VT1 to VT4 are taken between the ninth point of time t9 and the tenth point of time t10. The differential input voltage VDI=I·RM refers to the voltage drop across the shunt resistor 51 (shown in FIG. 4A. but not shown in FIG. 3; nevertheless the same setup applies for FIG. 3) during the current pulse between the fifth and the seventh point of time t5-t7.

In FIGS. 2A and 4A, the supplementary circuit 29, 29' is configured with the functionality to create the error with the aim to compensate limitations (error, linearity) of the classic peak-detector, regardless of the rectifying element used. The accompanying control signals in FIG. 2B or 4B are configured for the purpose of signal evaluation as in equation 5.

FIG. 6 shows an example of details of the peak-detector circuit 10 which is a further development of the above-shown examples. The peak-detector circuit 10 includes a first detector output 53. The peak detector circuit 10 comprises an evaluation circuit 52 that is connected on the input side to the first and the second terminal 13, 22 and on the output side to the first detector output 53. In this example, the evaluation circuit 52 is realized as an adding circuit 55.

The adding circuit 55 comprises an operational amplifier 56 and a first to a third adder resistor 57 to 59. An output of the operational amplifier 56 is coupled to the first detector output 53. The first terminal 13 is coupled via the first adder resistor 57 to a first input of the operational amplifier 56. The second terminal 22 is coupled via the second adder resistor 58 to the first input of the operational amplifier 56. The first input of the operational amplifier 56 is coupled via the third adder resistor 59 to the output of the operational amplifier 56. A first and a second buffer 60, 61 of the adding circuit 55 may be arranged between the first and the second terminal 13, 22 and the first and the second adder resistor 57, 58. The first and the second buffer 60, 61 are realized by operational amplifiers. A second input of the operational amplifier 56 is coupled to the reference potential terminal 18. The first input of the operational amplifier 56 may be realized as an inverting input and the second input of the operational amplifier 56 may be realized as a non-inverting input.

The adding circuit 55 comprises first and second input terminals. The the first terminal voltage VT1 tapped from the first terminal 13 of the main circuit 19 is provided to the first input of the adding circuit 55. The second terminal voltage VT2 tapped from the second terminal 22 of the supplementary circuit 29 is provided to the second input of the adding circuit 55.

The first detector voltage VD1 is tapped at the first detector output 53. The resistance values of the first to the third adder resistor 57 to 59 may be equal. The adding circuit 55 generates the first detector voltage VD1 as a function of the sum of the first terminal voltage VT1 and the second terminal voltage VT2. More specifically, the first detector voltage VD1 may be the sum of the first terminal voltage VT1 and the second terminal voltage VT2 or the inverted sum of the first terminal voltage VT1 and the second terminal voltage VT2. The amount of the first detector voltage VD1 is equal to the peak value VPK of the first input voltage VD1. Thus, in the example of FIG. 6, the first detector voltage VD1 can be calculated:

$$VD1=-(VT1+VT2)=-VPK$$

In an embodiment, not shown, the peak-detector circuit 10 comprises an inverting circuit coupling the output of the operational amplifier 56 to the first detector output 53. In this case: VD1=VT1+VT2=VPK In an embodiment, not shown, the current measurement arrangement 50 may comprise an analog-to-digital converter 82 that is coupled on its input side to the output side of the peak-detector circuit 10. Thus, the analog-to-digital converter 82 is coupled to the first detector output 53.

In an embodiment, not shown, the second detector voltage VD2 is generated out of the third and the fourth terminal signal VT3, VT4 by an evaluation circuit 52 similar as shown in FIG. 6.

FIG. 7 shows an example of a current measurement arrangement 50 having the peak-detector circuit 10 which is a further development of the above-shown examples. The current measurement arrangement 50 may be included in a light-detection-and-ranging system (abbreviated LIDAR system). An example of such a LIDAR system is described in FIG. 8. The evaluation circuit 52 is connected on the input side to the first to the fourth terminal 13, 22, 33, 46. The peak-detector circuit 10 comprises the first and a second detector output 53, 54 which may be named e.g. a positive and a negative output. The evaluation circuit 52 comprises a first and a second differential amplifier 63, 64 coupling the first to the fourth terminal 13, 22, 33, 46 to the first and the second detector output 53, 54. The first differential amplifier 63 has a first input 65 connected to the first terminal 13 and a second input 66 connected to the third terminal 33. The second differential amplifier 64 has a first input 67 connected to the second terminal 22 and a second input 68 connected to the fourth terminal 46. The first inputs 65, 67 of the first and the second differential amplifier 63, 64 may be realized as non-inverting inputs. The second inputs 66, 68 of the first and the second differential amplifier 63, 64 may be implemented as inverting inputs.

The first and the second differential amplifier 63, 64 both have differential outputs. A first output 69 of the first differential amplifier 63 is connected to the first detector output 53 and a second output 70 of the first differential amplifier 63 is connected to the second detector output 54. Furthermore, a first output 71 of the second differential amplifier 64 is connected to the second detector output 54 and a second output 72 of the first differential amplifier 63 is connected to the first detector output 53. The first outputs 69, 71 of the first and the second differential amplifier 63, 64 may be realized as non-inverting outputs. The second outputs 70, 72 of the first and the second differential amplifier 63, 64 may be implemented as inverting outputs.

The first and the second differential amplifier 63, 64 are both realized as transconductance amplifiers. Both differential amplifiers 63, 64 may have the same characteristic, namely the same amplification factor gm. Two amplifier resistors 73, 74 are connected to the first and the second differential amplifier 63, 64.

The evaluation circuit 52 comprises a common mode terminal 77 and a first and a second resistor 78, 79. The common mode terminal 77 is coupled via the first resistor 78 to the first detector output 53 and via the second resistor 79 to the second detector output 54. The common mode terminal 77 is connected to a common mode terminal of the analog-to-digital converter 82. A common mode voltage VCM is provided at the common mode terminal 77.

The main circuits 19, 19' and the supplementary circuits 29, 29' may be realized e.g. such as shown by FIGS. 4A and 4B. The analog-to-digital converter 82 of the current measurement arrangement 50 may optionally be coupled to the first and the second detector output 53, 54.

A light source 80 is coupled to the current measurement arrangement 50. The light source 80 is connected in series to the shunt resistor 51. The current I that flows through the shunt resistor 51 also flows through the light source 80. The light source 80 may be realized as a vertical-cavity surface emitting laser (abbreviated as VCSEL) or a light-emitting diode (abbreviated LED). A driver 81 is coupled to the light source 80. For example, the driver 81 is coupled via the shunt resistors 51 and the light source 80 to the reference potential terminal 18.

Optionally, the control circuit 28 may be connected to the analog-to-digital converter 82 and to the driver 81 (by a not shown connection line). The control circuit 28 may provide a driver control signal SD to the driver 81. Since the control circuit 28 triggers the pulse of the current I, it is able to generate the first to the fourth control signal S1 to S4 at the appropriate points of time. The control circuit 28 may be a digital circuit realized e.g. by several logic gates, a state machine, a microprocessor, a microcontroller or a computer.

The driver 81 provides the current I for the light source 80. A second detector voltage VD2 is generated at the second detector output 54. A detector output signal SDO (which has the form of a voltage) is provided between the first and the second detector output 53, 54. The detector output signal SDO represents a peak in the current I. The detector output signal SDO is generated by the evaluation circuit 52 out of the first to the fourth terminal voltage VT1 to VT4, especially by combining a summing function and a subtraction function. The peak can be measured with high precision. The analog-to-digital converter 82 may generate a digitized detector output signal SDD out of the detector output signal SDO. The detector output signal SDO may follow the following equations:

$$SDO=VD1-VD2=VPK-VPKN;$$

$$SDO=f(VT1+VT2-VT3-VT4).$$

The detector output signal SDO is a function of the first to the fourth terminal voltage VT1 to VT4. The detector output signal SDO obtains the value of the peak of the differential input voltage VDI and thus of the current I.

One of the possible implementations to realize the functionality of equation 5 is to use two stages 63, 64 with their transconductances related to the amplifier resistors 73, 74. The currents are then mixed and fed to the first and the second resistor 78, 79 (matched with amplifier resistors 73, 74). The high voltage-outputs from the peak-detector circuit 10 are indirectly brought to low voltage. The terminal voltages VT1 to VT4 may be high-voltage outputs. Indirectly here means that the terminal voltages VT1 to VT4 are converted to currents (by the differential amplifier 63, 64 realized as transconductance amplifiers) and back to voltage, in the form as the detector output signal SDO (by the first and the second resistor 78, 79). The common mode of this voltage is set by the common mode voltage VCM. The detector output signal SDO is realized as a differential voltage, wherein SDO=VD1-VD2. Because the transconductance stages 63, 64 operate in the time between the pulses, their dynamic requirements are greatly relaxed and attainable.

In an alternative embodiment, not shown, the evaluation circuit 52 is realized different from FIGS. 6 and 7. For example, one could also think of the way to combine the charges stored in the first and the second capacitor 16, 21 or in the first to the fourth capacitor 16, 21, 32, 42 to generate the first detector voltage VD1 and/or the detector output signal SDO and to eliminate the error in this way.

Figure 8:
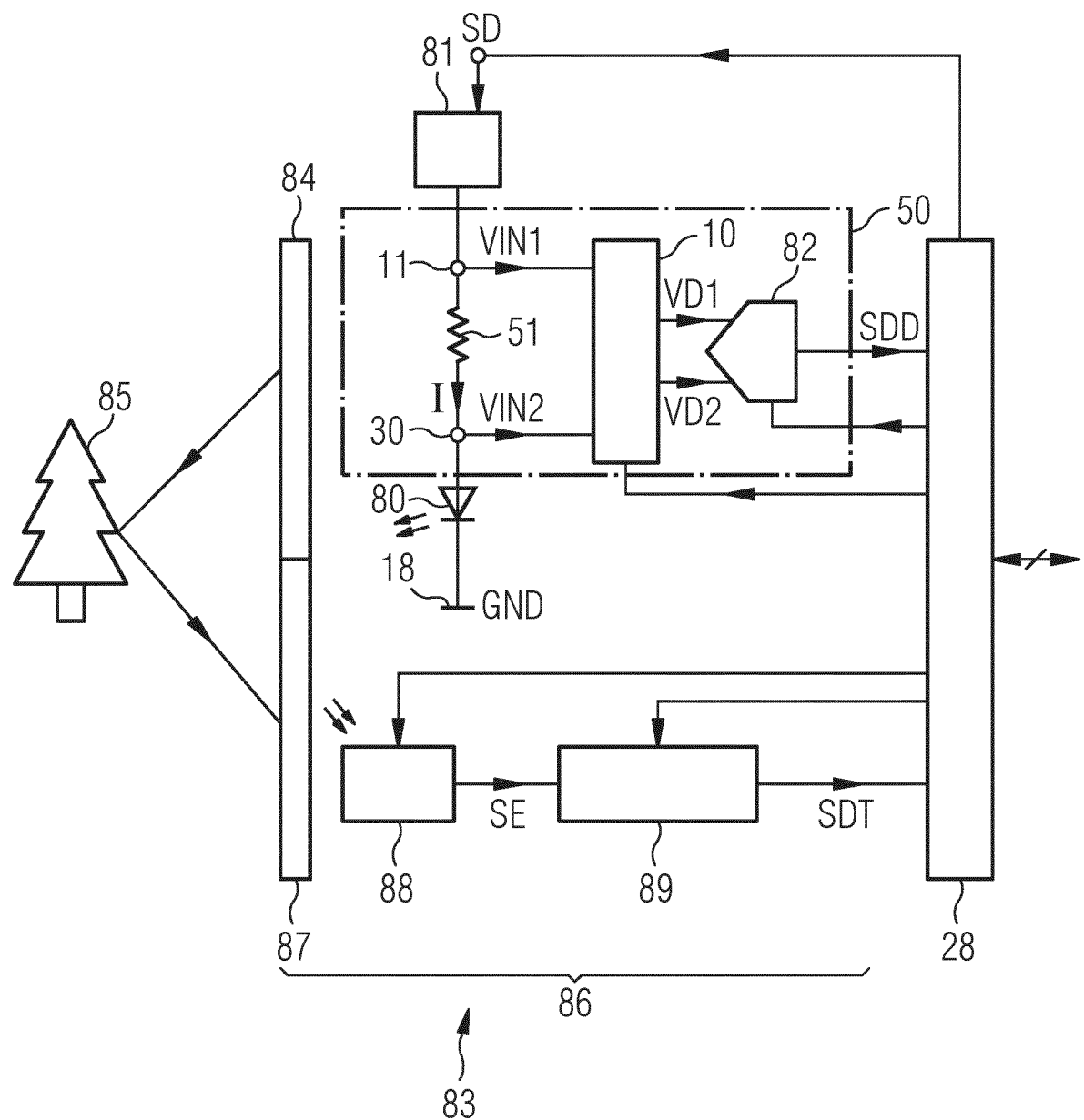
FIG. 8 shows an example of a light-detection-and-ranging system with a current measurement arrangement.

FIG. 8 shows an example of a light-detection-and-ranging system 83. The LIDAR system 83 comprises (but not only of) the current measurement arrangement 50, the light source 80 and the driver 81. An example of the current measurement arrangement 50, the light source 80 and the driver 81 and of their connections is shown in FIG. 7. Moreover, the LIDAR system 83 comprises a transmitting optics 84. The light source 80 emits light through the transmitting optics 84.

Additionally, the LIDAR system 83 comprises a receiving arrangement 86 having a receiving optics 87, a photodetector 88 and an analog circuit 89. The photodetector 88 may e.g. comprise an avalanche photodiode or an array of avalanche photodiodes. The analog circuit 89 is coupled to an output side of the photodetector 88. The analog circuit 89 may comprise at least one of an amplifier (such as a transimpedance amplifier), an electrical signal detector and an analog-to-digital converter.

Furthermore, the LIDAR system 83 comprises the control circuit 28 as shown e.g. in FIGS. 2A and 4A. The control circuit 28 is coupled to the driver 81. The control circuit 28 controls the driver 81 as a function of e.g. the digitized detector output signal SDD. Thus, the driver 81 is controlled as a function of a previous peak of the current I. The control circuit 28 is coupled to the analog circuit 89. The control circuit 28 may be coupled to the photodetector 88.

Light emitted by the light source 80 through the transmitting optics 84 is reflected by an object 85. Reflected light is detected by the photodetector 88 via the receiving optics 87 and is converted into an electrical signal SE by the photodetector 88. A data signal SDT is generated by the analog circuit 89 out of the electrical signal SE and is provided to the control circuit 28. The control circuit 28 may be used e.g. for data evaluation and data storage of the data signal SDT generated by the analog circuit 89. The LIDAR system 83 may include further subsystems such as e.g. at least a further light source, a further current measurement system and a further driver.

In an alternative embodiment, not shown, the tasks in the digital domain such as timing and controlling the circuit parts 10, 81, 82, 88, 89 of the LIDAR system 83, data storage, data evaluation and providing an interface to a higher level system are performed by different circuits. For example, the control circuit 28, which controls the driver 81, may be a part of the peak detector circuit 10 or of the current measurement arrangement 50. The LIDAR system 83 comprises a further control circuit. The further control circuit is realized e.g. as a microprocessor, a microcontroller or a computer. The further control circuit is coupled to the analog circuit 89 and to the control circuit 28. The further control circuit may be coupled to the photodetector 88.

The embodiments shown in the FIGS. 1 to 8 as stated represent example embodiments of the improved peak-detector circuit and method for evaluating a peak of a first input voltage; therefore, they do not constitute a complete list of all embodiments according to the improved sensor arrangement. Actual peak-detector circuits and methods for evaluating a peak of a first input voltage may vary from the embodiments shown in terms of circuit parts, structures and shape, for example.

LIST OF REFERENCE SIGNS 10 peak-detector circuit
11 first input terminal
13 first terminal
15 first rectifying element
16 first capacitor
18 reference potential terminal
19, 19' main circuit
20 second rectifying element
21 second capacitor
22 second terminal
23 first switch
25 first discharge switch
26 second discharge switch
27 first ground switch
28 control circuit
29, 29' supplementary circuit
30 second input terminal
31 third rectifying element
32 third capacitor
33 third terminal 40 third discharge switch
41 fourth rectifying element
42 fourth capacitor
43 second switch
44 fourth discharge switch
45 second ground switch
46 fourth terminal
50 current measurement arrangement
51 shunt resistor
52 evaluation circuit
53 first detector output
54 second detector output
55 adding circuit
56 operational amplifier
57 to 59 adder resistor
60, 61 buffer
63, 64 differential amplifier
65 to 68 input
69 to 72 output
73, 74 amplifier resistor
77 common mode terminal
78 first resistor
79 second resistor
80 light source
81 driver
82 analog-to-digital converter
83 light-detection-and-ranging system
84 transmitting optics
85 object
86 receiving arrangement
87 receiving optics
88 photodetector
89 analog circuit
EA, ER error
GND reference potential
I current
QF, QR charge
SD, S1 to S4 control signal
SDO, SDD detector output signal
SDT data signal
SE electrical signal
SOP pulse stop signal
SST pulse start signal
t time
t1 to t11 first to eleventh point of time
VCM common mode voltage VCM
VDI differential input voltage
VD1 first detector voltage
VD2 second detector voltage
VPK, VPKN peak value
VIN1 first input voltage
VIN2 second input voltage
VT1 to VT4 first to fourth terminal voltage

The invention claimed is:

1. A peak-detector circuit comprising:
a first input terminal for providing a first input voltage;
a first rectifying element with an anode connected to the first input terminal;
a first capacitor with a first electrode connected to a cathode of the first rectifying element;
a first terminal coupled to the first electrode of the first capacitor;
a second rectifying element with a cathode connected to the first input terminal;
a second capacitor;
a first switch coupling an anode of the second rectifying element to a first electrode of the second capacitor; and
a second terminal coupled to the first electrode of the second capacitor;
the peak-detector circuit further comprising:
a second input terminal;
a third rectifying element with an anode connected to the second input terminal;
a third capacitor with a first electrode connected to a cathode of the third rectifying element;
a third terminal coupled to the first electrode of the third capacitor;
a fourth rectifying element with a cathode connected to the second input terminal;
a fourth capacitor;
a second switch coupling an anode of the fourth rectifying element to a first electrode of the fourth capacitor; and
a fourth terminal coupled to the first electrode of the fourth capacitor.

2. The peak-detector circuit of claim 1,
further comprising a first discharge switch coupling the first electrode of the first capacitor to a reference potential terminal.

3. The peak-detector circuit of claim 1,
further comprising a second discharge switch coupling the first electrode of the second capacitor to a reference potential terminal.

4. The peak-detector circuit of claim 1,
further comprising a first ground switch coupling the anode of the second rectifying element to a reference potential terminal.

5. The peak-detector circuit of claim 1,
wherein the first rectifying element and the second rectifying element are configured as one of a diode, a Schottky diode, a junction diode, and a bipolar transistor connected in a diode configuration.

6. The peak-detector circuit of claim 1, further comprising an evaluation circuit comprising:
a first differential amplifier coupled on the input side to the first terminal and the third terminal and on the output side to a first detector output and a second detector output of the peak-detector circuit; and
a second differential amplifier coupled on the input side to the second terminal and the fourth terminal and on the output side to the first detector output and the second detector output of the peak-detector circuit.

7. The peak-detector circuit of claim 6,
wherein the first differential amplifier and the second differential amplifier are configured as transconductance amplifiers.

8. The peak-detector circuit of claim 6,
wherein the evaluation circuit comprises a first resistor and a second resistor and a common mode terminal; and
wherein the common mode terminal is coupled via the first resistor to the first detector output and via the second resistor to the second detector output.

9. A current measurement arrangement comprising:
the peak-detector circuit of claim 1; and
a shunt resistor that couples the first input terminal of the peak-detector circuit to the second input terminal of the peak-detector circuit and is configured such that a current flows through the shunt resistor.

10. A light-detection-and-ranging system comprising:
the current measurement arrangement of claim 9;
a light source;
a driver for providing the current, wherein the current drives the light source and flows through the shunt resistor; and
a receiving arrangement.

11. A peak-detector circuit comprising:
a first input terminal for providing a first input voltage;
a first rectifying element with an anode connected to the first input terminal;
a first capacitor with a first electrode connected to a cathode of the first rectifying element;
a first terminal coupled to the first electrode of the first capacitor;
a second rectifying element with a cathode connected to the first input terminal;
a second capacitor;
a first switch coupling an anode of the second rectifying element to a first electrode of the second capacitor;
a second terminal coupled to the first electrode of the second capacitor; and
an evaluation circuit with an adding circuit including:
  a first input coupled to the first terminal,
  a second input coupled to the second terminal, and
  a first detector output for providing a first detector voltage which is a function of the sum of a first terminal voltage tapped at the first terminal and of a second terminal voltage tapped at the second terminal.

12. A peak-detector circuit comprising:
a first input terminal for providing a first input voltage;
a first rectifying element with an anode connected to the first input terminal;
a first capacitor with a first electrode connected to a cathode of the first rectifying element;
a first terminal coupled to the first electrode of the first capacitor;
a second rectifying element with a cathode connected to the first input terminal;
a second capacitor;
a first switch coupling an anode of the second rectifying element to a first electrode of the second capacitor; and
a second terminal coupled to the first electrode of the second capacitor;
further comprising a first discharge switch coupling the first electrode of the first capacitor to a reference potential terminal;
further comprising a second discharge switch coupling the first electrode of the second capacitor to a reference potential terminal; and/or
further comprising a first ground switch coupling the anode of the second rectifying element to a reference potential terminal.

13. A method for evaluating a peak of a first input voltage by a peak-detector circuit of claim 12, wherein the method comprises:
providing the first input voltage via a first input terminal to an anode of a first rectifying element, wherein a first electrode of a first capacitor is connected to a cathode of the first rectifying element;
providing a first terminal voltage at a first terminal coupled to the first electrode of the first capacitor;
providing the first input voltage via the first input terminal to a cathode of a second rectifying element, wherein a first switch couples an anode of the second rectifying element to a first electrode of a second capacitor; and
providing a second terminal voltage at a second terminal that is coupled to the first electrode of the second capacitor.

14. The method of claim 13,
wherein the peak-detector circuit further comprises an evaluation circuit with an adding circuit; wherein the method further comprises:
providing the first terminal voltage to a first input of an adding circuit;
providing the second terminal voltage to a second input of the adding circuit; and
forming the sum of the first terminal voltage and the second terminal voltage and providing a detector voltage as a function of the sum of the first terminal voltage and the second terminal voltage.

* * * * *